United States Patent [19]

Studley

[11] Patent Number: 4,596,390
[45] Date of Patent: Jun. 24, 1986

[54] CONTROL CARTRIDGE SELECTION DEVICE

[76] Inventor: Fred M. Studley, 86 W. Chapel St., Abington, Mass. 02351

[21] Appl. No.: 459,183

[22] Filed: Jan. 19, 1983

[51] Int. Cl.$^4$ ............................................. A63F 9/22
[52] U.S. Cl. ........................ 273/148 B; 273/DIG. 28
[58] Field of Search .......... 273/1 E, 85 G, DIG. 28, 273/148 B; 365/52, 63, 72; 360/92; 206/387

[56] References Cited

U.S. PATENT DOCUMENTS

| | | | |
|---|---|---|---|
| 3,631,536 | 12/1971 | Mosman | 365/63 X |
| 4,141,045 | 2/1979 | Sheehan | 360/92 |
| 4,142,180 | 2/1979 | Burson | 273/DIG. 28 X |
| 4,156,928 | 5/1979 | Inose et al. | 273/DIG. 28 X |
| 4,275,425 | 6/1981 | Watanabe et al. | 360/92 |
| 4,386,773 | 6/1983 | Bronstein | 273/DIG. 28 X |

Primary Examiner—William H. Grieb
Attorney, Agent, or Firm—Thomas C. O'Konski

[57] ABSTRACT

A device for permitting the individual selection any one of a plurality of control cartridges of the type commonly used in conjunction with cartridge controlled apparatus such as a video computer system. A holder holds the cartridges in a plurality of separate storage trays. Switch means, which may be either mechanical or electrical, are actuatable by a user to electrically connect one of the cartridges stored in the holder to an output cable. The output cable, in turn, connects to an adapter that fits in the receptacle of the computer system where the cartridges are normally plugged individually and directly.

16 Claims, 7 Drawing Figures

CONTROL CARTRIDGE SELECTION DEVICE

BACKGROUND OF THE INVENTION

This invention relates generally to control cartridges which provide auxilliary electrical signal information to apparatus such as a video computer system, and more particularly, to a device for holding a plurality of such control cartridges and for permitting the selection and application of a given one of the cartridges to the system when desired.

The small computer industry is growing at a rapid pace, with particularly rapid growth taking place in the home video computer field. A typical home video computer system includes a control module that connects either to a dedicated cathode ray tube (CRT) set forming part of the system, or to any standard television set within the household. The control module contains a microprocessor and other associated electronics for generating, and effecting basic control over, a video image that is displayed on the set. Hand controllers may be electrically coupled to the control module for transfering active control inputs from a user to the control module electronics. The control module also includes a receptacle for receiving control cartridges. Each control cartridge is plugged into the receptacle individually, and contains preprogrammed electronics unique to a particular program or game. When received in the receptacle, the cartridge electronics cooperate with the permanent electronics of the control module and the control inputs provided by the hand controllers to enable the particular program or game to be displayed and performed on the set.

Typically, the control cartridge consists of an outer plastic housing which encloses a printed circuit (PC) board containing the preprogrammed electronics in the form of solid state circuitry. A portion of the PC board is accessible through an open end of the cartridge housing and includes a plurality of contacts to which electrical connection is made when the cartridge is plugged into the control module receptacle.

It is not unusual for a given household with a video computer system of the above-described type to have an average of a dozen or more separate control cartridges which are used with the system. Given that the value of a user's inventory in control cartridges is usually quite substantial, security and protection of the cartridges when not in use is an important consideration. Furthermore, a typical user uses more than one control cartridge at any one sitting. In order to effect a change from one cartridge to another, the user must dislodge the last cartridge from the control module receptacle, place it in storage, withdraw the selected cartridge from storage, and then plug the selected cartridge in the receptacle before use of the selected cartridge can commence. The repeated action of engaging and disengaging cartridges relative to the control module, in addition to creating inconvenience for the user, can with time cause damage to the electrical contacts within the control module receptacle, or to the cartridge PC board and its contacts. Such damage can, in turn, lead to substantial repair or replacement costs.

SUMMARY OF THE INVENTION

It is, accordingly, a principal object of the present invention to provide a device useful with cartridge controlled apparatus, such as, for example, a video computer system, for holding and permitting the individual selection of control cartridges normally used with such apparatus.

Another object of the invention is to provide a device of the above-described type which permits the semi-permanent storage of a plurality of control cartridges, and the selection and application of any particular one of the plurality of stored cartridges to apparatus in which the cartridges are normally received individually, without requiring that the cartridges actually be engaged or disengaged relative to the apparatus.

Another object of the invention is to provide a device of the above-described type which can be used as an add-on component with commercially available cartridge controlled apparatus and which does not require modification of such apparatus in order for it to be used.

Still another object of the invention is to provide a device of the above-described type which is durable in use yet reasonably inexpensive to manufacture.

Other objects of the invention will in part be specified in, and in part be obvious from, the detailed description of illustrative embodiments set forth hereinbelow.

Briefly, a control cartridge selection device embodied in accordance with the present invention comprises a holder for holding a plurality of control cartridges of the type conventionally used with cartridge controlled apparatus such as a video computer system. An electrical connector of a type compatible with such cartridges is mounted within the holder. An adapter is provided which plugs in, and makes electrical connection to, a receptacle in the apparatus that normally receives the control cartridges individually. Coupling means, such as, for example, a length of flexible cable, provide an electrical path between the electrical connector within the holder and the adapter of the device. Switch means actuatable by the user enable the selection of a given one of the control cartridges stored within the holder and the electrical coupling of the selected cartridge through the connector and coupling means to the adapter.

The switch means of the device may be either mechanical or electrical. In a mechanical embodiment of the device, switching is accomplished by a selection bar which is movable relative to the cartridges which are held in the holder and which carries with it during such movement at least part of the electrical connector. To select a given cartridge, the bar is moved to a position in registry with the desired cartridge and in which the connector engages with the desired cartridge. Once engaged, the cartridge is electrically coupled through the connector and the coupling means to the adapter. With the adapter plugged in the receptacle of the cartridge controlled apparatus, the connection is the same as if the selected cartridge had been plugged therein directly.

In an electrical embodiment of the device, the electrical connector actually comprises a plurality of electrical connector members. Each cartridge that is held in the holder electrically engages with one of the electrical connector members. Each of the plurality of connector members is electrically coupled to a switching circuit which, in turn, is controlled by a set of key switches mounted on the holder. To select a given cartridge, the user activates the key switch associated with that cartridge. The switching circuit responds to the activated switch by electrically coupling the selected cartridge to the coupling means and, in turn, to the adapter and cartridge controlled apparatus.

The holder of the present device is preferably designed so that it semi-permanently stores the control cartridges in an array of separate trays or compartments, thus providing a high degree of protection for the user's valuable inventory of cartridges. The user can load the cartridges of his or her own choice into the holder, and change the cartridges in the holder whenever a different grouping of cartridges is desired.

Because of its selection feature, the present device eliminates the inconvenience normally associated with inserting and withdrawing control cartridges relative to the cartridge controlled apparatus each time a cartridge change is desired. Furthermore, the adapter of the present device can be made compatible with any of a variety of commercially available computer systems, and the device used as a plug-in, add-on component to such a system without the need to modify or otherwise tamper with the system electronics. By fabricating the holder of the device from a suitable material, such as high impact plastic, the device can also be manufactured at reasonable cost, and in a form that is light in weight, portable and durable in use.

BRIEF DESCRIPTION OF THE DRAWING

The foregoing and other objects, features and advantages of the invention will be better understood by reference to the following detailed description of illustrative embodiments taken in conjunction with the accompanying drawing in which.

DESCRIPTION OF ILLUSTRATIVE EMBODIMENTS

Figure 1:
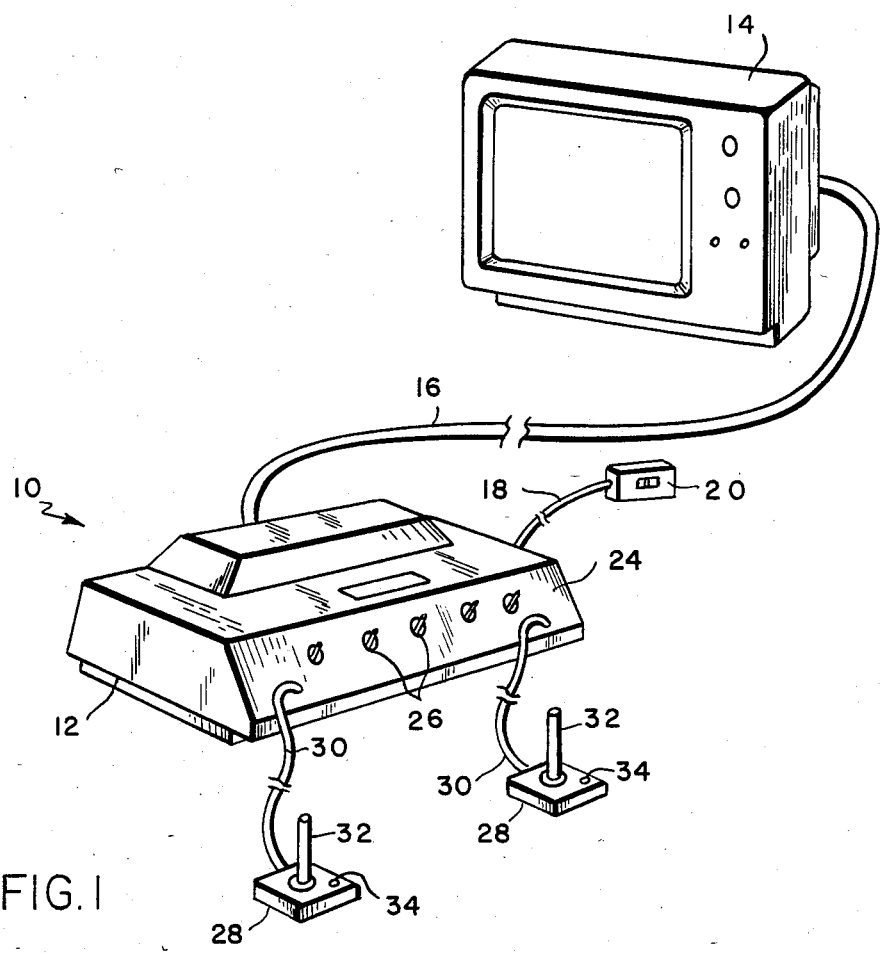
FIG. 1 is a perspective view of the basic components of a conventional video computer system of the type with which the device of the present invention is useful.

Referring now to the drawing, and initially to FIG. 1 thereof, there is shown a conventional video computer system 10 of the type with which the device of the present invention may be used. The system 10 comprises a main control module 12 which typically contains a microprocessor and other conventional electrical signal generating and processing means adapted to generate, and effect basic control over, a video image that is displayed upon a standard television set 14. The video output of the control module 12 is coupled by a multiple-conductor cable 16 to the antenna terminal leads (not shown) at the rear of the television set 14. Power to the control module 12 is provided through a power cord 18 having a standard line voltage AC adapter 20 affixed to its end. Power can thus be derived from a standard line wall outlet which is accessible by the power cord 18.

The control module 12 includes a front panel 24 with a plurality of switches 26. The switches 26 typically permit a user to turn power to the module 12 on and off, to select particular program or game modes, and to select skill levels. Further user control input to the module 12 is made through a pair of hand controllers 28 which are coupled by plug-in cables 30 to the module 12. The hand controllers 28 may have a familiar "joy stick" control knob 32 and "fire" button 34 which enable a multiplicity of active control inputs to be coupled to the module 12. Other forms of hand controllers, such as key switch pads or turn knobs, may also be used.

Figure 2:
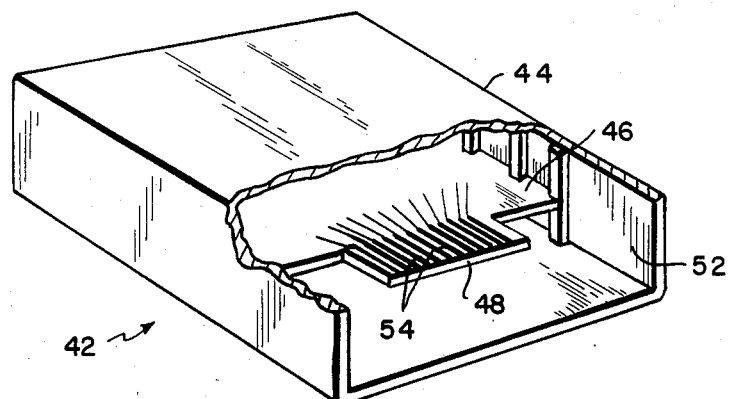
FIG. 2 is a perspective view, partly cut-away, of a solid state control cartridge of the type conventionally used in conjunction with the system shown in FIG. 1.

The front panel 24 of the control module 12 also includes a receptacle 40 for receiving a control cartridge 42. A typical such cartridge 42 is shown in FIG. 2. The cartridge 42 includes an outer housing 44 having a relatively flat, generally rectilinear shape which encloses a printed circuit (PC) board 46 having preprogrammed electronics incorporated thereon in the form of solid-state circuitry. These electronics are typically unique to a given game or program. As can be appreciated from FIG. 2, the PC board 46 of cartridge 42 includes a contact end portion 48 which is recessed within an open end 52 of the housing 44. The end portion 48 of the PC board 46 includes a plurality of contact strips 54 formed in parallel along its surface. When the open end 52 of the cartridge 42 is plugged into the receptacle 40 in the control module 12 (FIG. 1), a plurality of electrical contact members (not shown) within the receptacle 40 make electrical connection to the contact strips 54 (FIG. 2). In this way, the cartridge 42 is electrically coupled to the control module 12, and the preprogrammed electronics of the cartridge 42 can cooperate with the permanent electronics of the control module 12 and the control inputs provided by the hand controllers 28 to enable the particular game or program associated with the cartridge 42 to be displayed and performed on the set 14.

The specific details of the video computer system 10 shown in FIGS. 1 and 2 are not crucial to the control cartridge selection device of the present invention since, as explained more fully below, the device may be adapted for use with any of a variety of the currently available systems on the market. For purposes of illustration only, the system 10 shown in FIG. 1 may be a Model 2600 video computer system marketed commercially by Atari, Inc. of Sunnyvale, Calif. Further details of the construction and operation of that system may be obtained from various product literature available from Atari, Inc.

Figure 3:
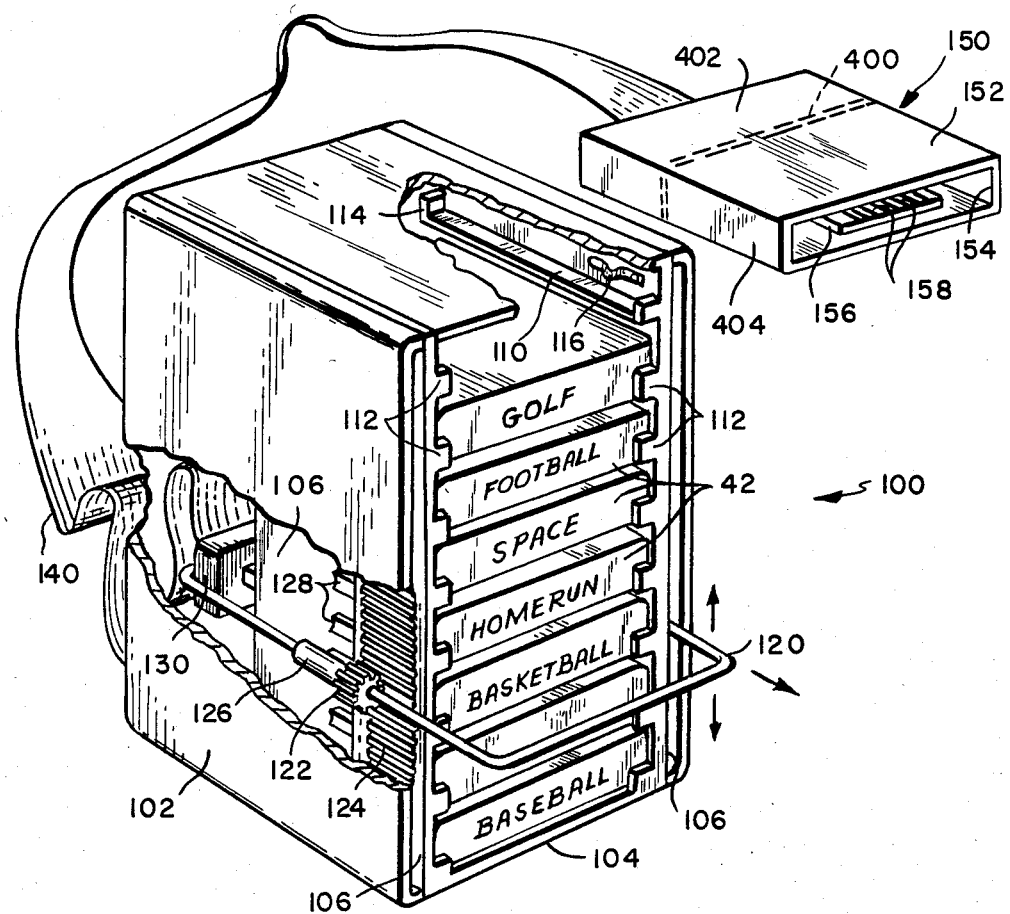
FIG. 3 is a perspective view, partly cut-away, of a first embodiment of a control cartridge selection device in accordance with the present invention.

FIG. 3 of the drawing illustrates a first embodiment of the control cartridge selection device of the invention. The device 100 shown in FIG. 3 comprises a holder 102 having the shape of a relatively tall, straight-sided box which is closed on all sides except for its front 104. A pair of inner side walls 106 are formed within the holder 102 in parallel, spaced apart relationship to its respective outer side walls. As can be appreciated by viewing the holder 102 through the cut-away section of the side wall visible in FIG. 3, each of the inner side walls 106 extends rearwardly to only a portion of the depth of the holder 102, so that the rear portion of the holder 102 defines an open vertical space or compartment. The depth of the walls 106 into the holder 102 preferably is slightly greater than the length of a control cartridge 42 of the type illustrated in FIG. 2. The walls 106 are also preferably spaced apart from one another by a distance that is slightly wider than the width of a control cartridge 42.

Formed on each inwardly looking surface of the inner side walls 106 are a plurality of vertically spaced, inwardly protruding, horizontally disposed ribs 110. Each rib 110 includes an upwardly extending tab 112 at the front edge of the walls 106, and an upwardly extending tab 114 at the rear edge of the walls 106 within the holder 102 (see the cut-away section of the top wall of the holder 102 in FIG. 3). The ribs 110 and tabs 112 and 114 combine to define a plurality of separate trays for holding and storing a corresponding plurality of control cartridges 42, one above the other in an array, as illustrated for all but the uppermost tray in FIG. 3.

To load one of the cartridges 42 into the holder 102, the open end 52 of the cartridge 42 is slid in through the opening above the front tabs 112 in a given tray. When fully inserted, the cartridge 42 is pushed downwardly so that it rests on the ribs 110 behind the front tabs 112. The front tabs 112 prevent the cartridges 42 from sliding forwardly out of the holder 102 after they are loaded, while the rear tabs 114 prevent the cartridges 42 from sliding rearwardly into the open space at the rear of the holder 102. If desired, a plurality of resilient tabs 116 (see top wall cut-away section in FIG. 3) may be affixed to the inwardly looking surface of each inner side wall 106 above each rib 110 to assist in holding each cartridge 42 securely in position in its tray after it is loaded.

When it is desired to remove one of the cartridges 42 from the holder 102, the end of the cartridge 42 exposed at the front of the holder 102 is first tilted upwardly above the front tabs 112 until the cartridge again clears the tabs 112, and is then pulled outwardly from the holder 102.

A relatively rigid, generally U-shaped selection bar 120 is movable upwardly, downwardly, inwardly and outwardly in the space between the inner side walls 106 and outer side walls of the holder 102. Rotatably mounted on each leg of the bar 120 within that space is a pinion gear 122. Each pinion gear 122 engages within a vertically disposed gear track or rack 124 formed on the outwardly looking surfaces of each of the inner side walls 106. When the bar 120 is moved upwardly and downwardly relative to the holder 102, the gears 122 rotate about the bar 120 as their teeth engage in the racks 124. When the bar 120 is moved inwardly or outwardly relative to the holder 102, the teeth of the gears 122 slide within, and are guided by, the teeth of the racks 124. This rack and pinion arrangement helps insure that the bar 120 moves both freely and smoothly, without twisting or jamming, when it is moved relative to the holder 102.

Each pinion gear 122 has a toothless rearward extension 126 which is adapted to engage within a plurality of vertically spaced detents 128 formed on the outwardly looking surface of each inner side wall 106. Each detent 128 is vertically centered relative to one of the cartridges 42 stored in the holder 102. The detents 128 assist in locating the selection bar 120 vertically relative to a given cartridge when a cartridge selection is being made. As the bar 120 is moved upwardly or downwardly relative to the holder 102, the user senses through the bar 120 the engagement of a pair of detents 128 each time vertical alignment is achieved with one of the stored cartridges 42.

Fixed to the ends of the selection bar 120 at the rear of the holder 102 is an electrical connector 130. The connector 130, which is shown in more detail in FIG. 4, comprises a base 132 to which the legs of the bar 120 are fixed, and a raised platform 134 which is dimensioned so as to fit within the open end 52 of each cartridge 42. The side walls of the platform 134 may be tapered slightly so that it is guided into the open end 52 of the cartridge 42 when the connector 130 is moved toward the cartridge. Protruding outwardly from the platform 134 is a rigid lip 136 which carries on its top surface a plurality of upstanding resilient electrical contact members 138. These contact members 138 are positioned so as to engage with, and make electrical connection to, the contact strips 54 (FIG. 2) on the contact end portion 48 of the cartridge PC board 46 when the connector 130 is engaged with any one of the cartridges 42 stored in the holder 102.

Figure 4:
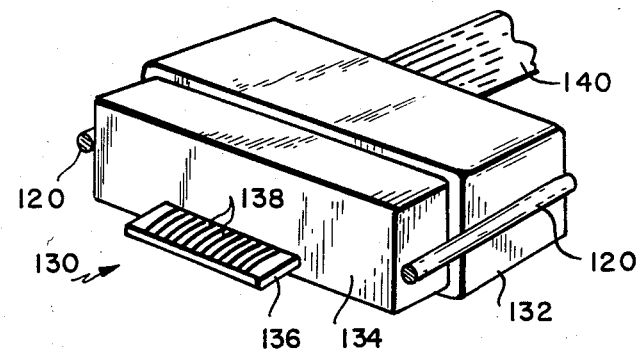
FIG. 4 is a perspective view showing further detail of an electrical connector used in the control cartridge selection device of FIG. 3.

As noted, the contacts members 138 are formed on the top surface of the lip 136 in the connector 130. This is because, in a typical control cartridge 42, the contact ribbons 54 are actually formed on the bottom surface of the cartridge PC board 46. Thus, the cartridge 42 shown in FIG. 2 is actually shown in an inverted, or upside down, position in terms of the orientation of the cartridges 42 shown in FIG. 3. Obviously, if the cartridge contact ribbons 54 are formed on the upper surface of the PC board 46, the orientation of the lip 136 and contact members 138 would have to be inverted from that which is shown in FIG. 4.

Each contact member 138 in the connector 130 is electrically coupled to a conductor in a multiple-conductor, flexible ribbon cable 140. As shown in FIG. 4, the cable 140 extends outwardly from the rear of the connector 130. As shown in FIG. 3, a sufficient length of the cable 140 is stored in the rear compartment of the holder 102 so that the selection bar 120 may be moved freely from the bottom to the top of the holder 102 without interference from the cable 140.

Referring still to FIG. 3, the cable 140 extends outwardly through the rear wall of the holder 102 and, after a given length of cable, is terminated in an adapter 150. The adapter 150 includes a housing 152 having an open end 154 and substantially the same shape and size as the housing 44 of one of the control cartridges 42. A PC board 156 is exposed through the open end 154 of the adapter housing 152. The PC board 156 has a plurality of contact strips 158 formed in parallel on its surface which are substantially the same shape and size as the contact strips 54 in the control cartridges 42. The individual conductors of the cable 140 are electrically connected to contact strips 158 through the PC board 156 of the adapter 150.

The device 100 of FIG. 3 is used by placing it near-by the control module 12 of the video computer system 10 of FIG. 1, and plugging the adapter 150 into the receptacle 40 which normally receives the control cartridges 42.

With the control cartridges 42 loaded in the holder 102, as shown in FIG. 3, a user selects a given cartridge by first insuring that the selection bar 120 is depressed inwardly relative to the holder 102 in the position indicated in FIG. 3. The bar 120 is then moved upwardly or downwardly relative to the holder 102 until it snaps into the detents 128 associated with the particular cartridge 42 he or she desires to use. The bar 120 is then pulled outwardly away from the holder 102 so that the connector 130 engages the selected cartridge 42. The cartridge electronics are then electrically coupled through the cable 140 and the adapter 150 to the control module 12 in the same manner as if the cartridge had been plugged directly in the module 12.

When the user desires to change cartridges, the selection bar 120 is first pushed inwardly to disengage the connector 130 from the last used cartridge. The bar 120 can then be moved as desired upwardly or downwardly to the position of a new cartridge which is then engaged by again moving the bar 120 to its outward position.

Figure 5:
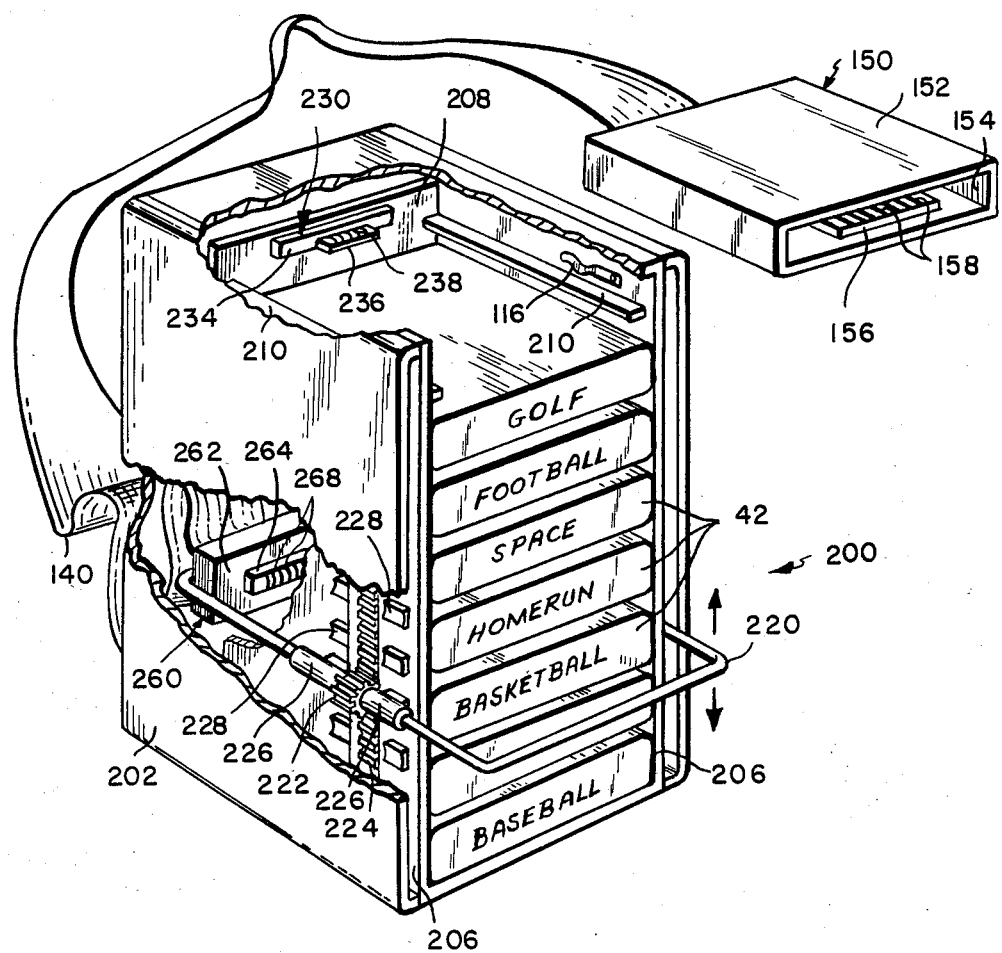
FIG. 5 is a perspective view, partly cut-away, of a second embodiment of a control cartridge selection device in accordance with the invention.

FIG. 5 illustrates a second, somewhat modified embodiment of the control cartridge selection device of the invention. The device 200 shown in FIG. 5 is identical in many respects to the device 100 previously described. Those parts which are identical are referenced with identical reference numerals.

The device 200 includes a holder 202 which has a pair of inner side walls 206 and a shape, size and general configuration similar to the holder 102 previously described. Cartridges 42 are supported in the holder 202 on a plurality of vertically spaced, inwardly protruding, horizontally disposed ribs 210 formed on the inside surfaces of the inner side walls 206 (see the cut-away section of the top wall of the holder 202 in FIG. 5). An inner rear wall 208 is formed within the holder 202 to the rear of each rib 210 so as to be parallel to, but spaced from the outer rear wall of the holder 202. An electrical connector member 230 is mounted in the wall 208 to the rear of each vertically aligned pair of ribs 210. Each connector member 230 is similar in construction to the electrical connector 130 of FIG. 4. Specifically, each connector member 230 includes a forwardly protruding platform 234 which is dimensioned to fit within the open end 52 of the cartridges 42, and a rigid lip 236 protruding from the platform 234 which carries a plurality of upstanding resilient contact members 238. The contact members 238 make electrical connection to the contact strips 54 in the cartridges 42 when the cartridges are loaded into the holder 202. For reasons to be explained below, each of the contact members 238 extends rearwardly completely through the inner rear wall 208 with a portion of each member 238 being exposed on the rear surface of the wall 208 (not shown).

The device 200 includes a selection bar 220 which is used in selecting one of the stored cartridges 42 for application to the video computer system 10 of FIG. 1. Unlike the selection bar 120 in the device 100, the bar 220 is designed to be moved only upwardly and downwardly relative to the holder 202 during the selection process. Each leg of the bar 220 has a pinion gear 222 rotatably mounted thereon which engages in a vertically disposed rack 224 formed in the outside surface of each of the inner side walls 206. Each gear 222 has a forward and rearward toothless extension 226 which engage in a plurality of vertically spaced detents 228 formed on each side of the rack 224. As with the detents 128 in the device 100, the detents 228 assist the user in obtaining accurate alignment with a given cartridge 42 during the selection process.

The ends of the legs of the selection bar 220 are fixed to, and carry with them, an electrical connector member 260. The connector member 260 comprises a base 262 to which the legs of the bar 220 are fixed, a forwardly protruding platform 264, and a plurality of forwardly protruding, resilient electrical contact members 268 which are mounted on the forwardly directed face of the platform 264. The contact members 268 are adapted to make sliding contact with the rear surface of the inner rear wall 208 of the holder 202 as the bar 220 is moved upwardly and downwardly relative to the holder 202. The contact members 268 also extend through the base 262 where they are electrically connected to the conductors of multiple conductor cable 140.

When the bar 220 is vertically aligned with a given cartridge 42 stored in the holder 202, the contact members 268 make physical and electrical contact with the portions of the contacts members 238 which are exposed at the rear surface of the inner rear wall 208 and which extend from the connector member 230 associated with that particular cartridge 42. In this way, the selected cartridge 42 is electrically coupled through the complimentary connector members 230 and 260 to the cable 140 and, in turn, to the adapter 150.

The device 200 of FIG. 5 is used essentially in the same way as the device 100 previously described. However, because of the sliding contact arrangement provided by the complimentary connector members 260 and 230, the bar 220 need be moved only either upwardly or downwardly during the selection process.

It will be noted that the holder 202 of the device 200 does not include the front tabs 112 which are included in the holder 102 of the device 100. In the device 200, there are no outwardly directed forces exerted on the cartridges 42 by the bar 220 during the selection process. As a result of this, the frictional forces exerted on the inside walls of the cartridge housing 44 by the connector member platform 234, and the frictional forces exerted on the outside walls of the housing 44 by resilient tabs 116 are generally sufficient to hold the cartridges securely within the holder 202. Front tabs like the tabs 112 in the device 100, or any other suitable cartridge securing means, could, of course, be included in the device 200 if desired.

Figure 6:
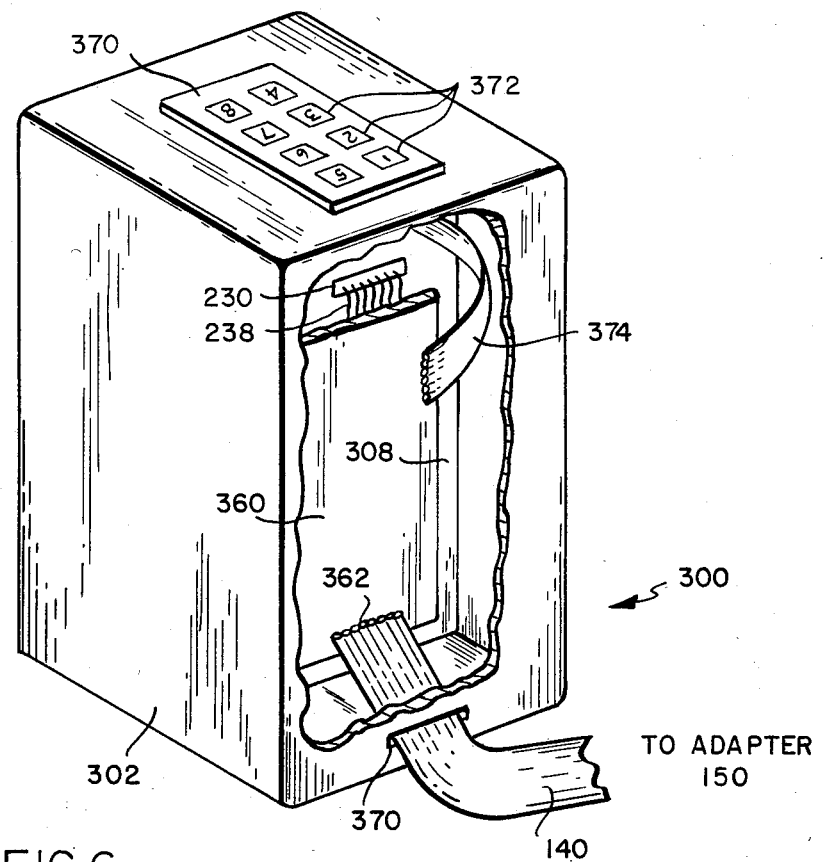
FIG. 6 is a perspective view, partly cut-away, showing the rear of a third embodiment of a control cartridge selection device in accordance with the invention.

FIG. 6 illustrates still another embodiment of the control cartridge selection device of the invention. The device 300, which is shown from the rear in FIG. 6, employs electrical selection, instead of mechanical selection, in switching from one cartridge to another.

Specifically, the device 300 includes a holder 302 which is substantially identical to the holder 202 in the device 200. Each of the cartridges 42 (not shown in FIG. 6) which is stored in the holder 302 is supported on a pair of horizontally disposed ribs 210 (see FIG. 5) and each such pair of ribs 210 has associated therewith an electrical connector member 230 (FIG. 5) which engages in the open end 52 of the cartridge housing 44. The rear of the connector member 230 for the uppermost cartridge location in the holder 302 is visible through the cut-away section in FIG. 6. The contact members 238 from the uppermost connector member 230, and those from all of the other connector members 230 in the holder 302, are extended as inputs to a PC board 360 which, as shown in FIG. 6, is mounted on the rear surface of the inner rear wall 308 within the holder 302.

A key pad 370 having a plurality of depressible key switches 372 is mounted on the top surface of the holder 302. The outputs from the key pad 370 are coupled through a flexible cable 374 as another input to the PC board 360.

The PC board 360 carries an electrical switching circuit which, in response to the depression of a given one of the key switches 372, electrically couples the connector member 230 of the cartridge 42 associated with the depressed key switch 372 to a set of output terminals 362. As indicated in FIG. 6, multiple conductor cable 140 is connected to the output terminals 362 of the PC board 360 and extends through an opening 370 in the outer rear wall of the holder 302 to an adapter 150 of the type shown in FIG. 3.

Figure 7:
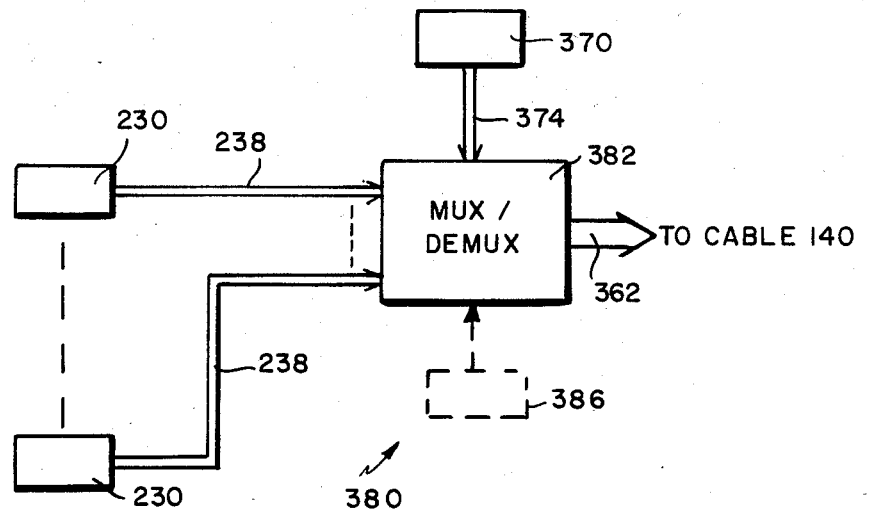
FIG. 7 is a block diagram of a switching circuit used in the control cartridge selection device of FIG. 6.

FIG. 7 is a generalized block diagram of an illustrative circuit 380 for performing the electrical switching functions described above in connection with the device 300. As indicated in FIG. 7, the contact members 238 from each electrical connector member 230 in the device 300 are coupled as data inputs to a MUX-DEMUX component 382. Typically, there are twelve contact members 238 extending from each connector member 230, one for each of twelve contact ribbons 54 in the cartridges 42. The key pad 370 is coupled through the cable 374 as the control input to the MUX-DEMUX component 382. The cable 374 carries control signals in a three-bit code to designate one of eight possible connector members 230. Depending upon the three bit code that is contained on the cable 374, the MUX-DEMUX component 382 establishes a bidirectional signal path between one set of the contact members 238 and the output terminals 362 to the exclusion of all the other sets of contact members 238. The output terminals 362 of the MUX-DEMUX component 382 are, in turn, connected to the cable 140 which extends to the adapter 150.

The MUX-DEMUX component 382 may be composed of a plurality of conventional multiplexers which are interconnected or electrically ganged so as to accommodate the twelve line inputs represented by each set of contact members 238. The interconnection of conventional multiplexers in the MUX-DEMUX component 382 is such that the component 382 functions both as a multiplexer and demultiplexer since it conducts signals in two directions, i.e., from the selected contact members 238 to the output terminals 362, and from the output terminals 362 to the selected contact members 238.

Power to the circuit 380 may be derived from the control module 12 of the video computer system 10 by tapping a power supply line conductor in the cable 140. Alternatively, the circuit 380 may be powered by a local power supply 386 mounted on the PC board 360, which may be battery powered or powered by its own AC line adapter similar to the line adapter 20 shown in FIG. 1.

The holders 102, 202 and 302 in the devices 100, 200 and 300, respectively, are preferably fabricated using conventional molding techniques from a high impact plastic. While other materials, such as wood, can be used for the holders 102, 202 and 302, plastic yields a holder that is light in weight, thus making the devices 100, 200 and 300 readily portable, and durable and rugged in use, thus capable of withstanding even the roughest of treatment. Plastic molding techniques also tend to be more inexpensive to use, helping keep the cost of the device as low as possible.

It should be understood that the devices 100, 200 and 300 shown and described above are intended to illustrate, rather than limit, the invention, and that numerous modifications and additions thereto will be apparent to those skilled in the art without departing from the scope of the invention, which is defined by the appended claims. For example, while the holders 102, 202 and 302 have been shown as including space for eight cartridges 42, they can be readily designed to hold either a greater or lesser number of cartridges 42. The holders can also be designed so that they can be stacked together, one on top of another and/or side-by-side, and interconnected to a single adapter 150, where the user's inventory of cartridges exceeds the capacity of a single holder. In addition, while the holders 102, 202 and 302 have been shown as holding the cartridges 42 one above the other in a vertical array, they can be tilted and designed to rest on their side so that the cartridges are held side-by-side in a horizontal array. Provision can also readily be made for the inclusion of a removable dust cover for the front or open side of the holders 102, 202 and 302, as well as for the inclusion of a handle to facilitate carrying the holders from place to place.

It is well known that the various computer systems currently available on the market are not all compatible with one another, and that the control cartridges used with such systems are often of varied design. To accommodate these variations in design, the adapter 150 of the devices 100, 200 and 300 can actually have a two-part construction, as suggested by the dashed lines labelled 400 in the adapter 150 shown in FIG. 3. In such a case, the adapter 150 may comprise a first adapter member 402 which is permanently fixed to the cable 140, and a second adapter member 404 which is removably pluggable into the first adapter member 402. The second adapter member 404 can then be made compatible with a given computer system, and used interchangeably with other such members 404 which are compatible with other systems.

Furthermore, it will be appreciated by those skilled in the art that, while the devices 100, 200 and 300 have been described for use with the home video computer system 10 shown in FIG. 1, they can readily be used with other apparatus that normally receive control or auxiliary data input cartridges similar to the cartridge 42 shown in FIG. 2.

Accordingly, it is the intent of the appended claims to cover these and other such modifications and additions as come within the true scope of the invention.

What I claim is:

1. A cartridge selection device for use with apparatus of the type including electrical signal processing means and means defining a receptacle for receiving a cartridge for providing auxiliary electrical signal information to the electrical signal processing means of the apparatus, said device comprising:
   A. holder means for holding a plurality of the cartridges normally received within the receptacle of the apparatus;
   B. electrical connector means within said holder means for providing electrical connection to the cartridges to be held in said holder means;
   C. adapter means adapted to be received within the receptacle of the apparatus and to provide electrical connection to the electrical signal processing means of the apparatus;
   D. coupling means for carrying electrical signals between said electrical connector means and said adapter means; and
   E. switch means for enabling selection of one of the plurality of cartridges to be held in said holder means by electrically coupling the selected cartridge through said electrical connector means and said coupling means to said adapter means.

2. The device of claim 1 in which said switch means comprise mechanical means movable relative to said holder means which carry said electrical connector means during such movement, said mechanical means being movable to a plurality of first positions in which said electrical connector means are aligned with a selected one of the cartridges to be held in said holder means and to a second position in which said electrical connector means engage with the selected one of the cartridges to be held in said holder means thereby to electrically couple the selected one of the cartridges through said coupling means to said adapter means.

3. The device of claim 1 in which said electrical connector means comprise a plurality of first electrical connector members and a second electrical connector member, each of said first electrical connector members being mounted relative to said holder means so as to be engaged by one of the cartridges when held in said holder means, and in which said switch means comprise mechanical means movable relative to said holder means which carry said second electrical connector member during such movement, said mechanical means being movable to a plurality of positions in which said second electrical connector member engages with one of said first electrical connector members thereby to electrically couple the cartridge associated with said one of said first electrical connector members through said coupling means to said adapter means.

4. The device of claim 1 in which said electrical connector means comprise a plurality of electrical connector members, each of said electrical connector members being mounted relative to said holder means so as to be engaged by one of the cartridges when held in said holder means, and in which said switch means comprise electrical circuit means including user actuatable means for generating an input signal corresponding to each of said electrical connector members, said electrical circuit means being responsive to the receipt of one of said user input signals for electrically connecting the one of said electrical connector members corresponding to said user input signal to said coupling means thereby to electrically couple the cartridge to be engaged by said one of said electrical connector members through said coupling means to said adapter means.

5. The device of claim 1 in which said holder means includes a plurality of means for separately supporting each of the plurality of the cartridges adjacent to one another in an array in said holder means.

6. The device of claim 1 in which said coupling means comprises a length of multiple conductor flexible cable having a first end and a second end, said first end of said cable being connected to said electrical connector means within said holder and said second end of said cable being connected to said adapter means.

7. The device of claim 2 in which said holder means includes a plurality of means for separately supporting each of the plurality of the cartridges adjacent to one another in an array in said holder means, in which said mechanical means is movable along a first axis to the plurality of first positions in which said electrical connector means are aligned with a selected one of the cartridges to be held in said holder means, and in which said mechanical means is movable along a second axis orthogonal to said first axis to the second position in which said electrical connector means engages with the selected one of the cartridges to be held in said holder means.

8. The device of claim 2 in which each of the cartridges to be held in said holder means includes a contact end portion having a plurality of electrical contacts, and in which said electrical connector means includes a corresponding plurality of electrical contacts which mate with the electrical contacts on the cartridge contact end portion of the selected one of the cartridges when said mechanical means is moved to the second position.

9. The device of 3 in which said holder means includes a plurality of means for separately supporting each of the plurality of the cartridges adjacent to one another in an array in said holder means, in which each of said first electrical connector members is mounted relative to one of said cartridge supporting means so as to engage with one of the cartridges when held in said holder means, and in which said mechanical means is movable relative to the cartridge supporting means to the plurality of positions in which said second electrical connector member engages with one of said first electrical connector members.

10. The device of claim 3 in which each of the cartridges to be held in said holder means includes a contact end portion having a plurality of electrical contacts, in which each of said first electrical connector members includes a corresponding plurality of electrical contacts which mate with the electrical contacts on the contact end portion of one of the cartridges when that cartridge is held in said holder means, and in which said second electrical connector member also includes a corresponding plurality of electrical contacts which make sliding contact with the electrical contacts of said first electrical connector members when said mechanical means is moved to the plurality of positions.

11. The device of claim 4 in which said user actuatable means comprise key switch means including a plurality of key switches, one of said key switches corresponding to each of said electrical connector members.

12. The device of claim 4 in which each of the cartridges to be held in said holder means includes a contact end portion having a plurality of electrical contacts, in which each of said electrical connector members includes a corresponding plurality of electrical contacts which mate with the electrical contacts on the contact end portion of one of the cartridges when that cartridge is held in said holder means, in which the electrical contacts for each of said electrical connector members are coupled as inputs to said electrical circuit means, and in which said electrical circuit means respond to the receipt of one of said user input signals from said user actuatable means to electrically connect the electrical contacts of said one of said electrical connector members corresponding to said user input signal to said coupling means.

13. The device of claim 1 in which each of the cartridges to be held in said holder means includes a contact end portion having a plurality of electrical contacts, and in which said adapter means includes a contact end portion having a corresponding plurality of electrical contacts, the electrical contacts of said adapter means being coupled to said electrical connector means by said coupling means.

14. The device of claim 1 in which said adapter means comprises a first adapter member permanently connected to said coupling means and a second adapter member removably connectable to said first adapter member, said second adapter member being adapted to be received with the receptacle of the apparatus and to provide electrical connection to the electrical signal processing means of the apparatus.

15. A device for use with video computer apparatus of the type including a control module having electrical signal generating and processing means and receptacle means for receiving any one of a plurality of control cartridges that provide auxiliary electrical signal information to the electrical signal generating and processing means in the video computer apparatus, each of the control cartridges including an outer housing enclosing electrical circuitry and contact means accessible through one end of the housing for electrically connecting the cartridge circuitry to the electrical signal generating and processing means when one of the cartridges is received in the receptacle means, said device comprising:

A. holder means for holding in an array a plurality of the control cartridges normally received in the receptacle means of the video computer system;

B. electrical connector means mounted within said holder means for making electrical connection to the cartridge circuitry of each of the control cartridges to be held in said holder means;

C. adapter means adapted to be received in the receptacle means of the video computer apparatus and to make electrical connection to the electrical signal generating and processing means of the apparatus;

D. coupling means for carrying electrical signals between said electrical connector means and said adapter means; and E. switch means for enabling selection of any one of the plurality of the control cartridges to be held in said holder means by electrically coupling the selected cartridge through said electrical connector means and said coupling means to said adapter means, whereby, when said adapter means is received in the receptacle means, the circuitry of the selected cartridge is electrically coupled to the electrical signal generating and processing means in the video computer apparatus.

16. A video cartridge selector, comprising:

A. a housing;

B. a plurality of receptacles in said housing, each receptacle capable of removably storing a video cartridge;

C. connector means for electrically connecting said housing to a video device;

D. selection means for selecting a desired one of the cartridges; and

E. circuit means responsive to said selection means for coupling the selected cartridge to the video device through said connector means.

* * * * *